(12) United States Patent
Parkhurst et al.

(10) Patent No.: US 12,706,573 B2
(45) Date of Patent: Aug. 11, 2026

(54) INSTRUMENTATION AMPLIFIER WITH BASE CURRENT COMPENSATOR FOR IMPROVED PERFORMANCE

(71) Applicant: TEXAS INSTRUMENTS INCORPORATED, Dallas, TX (US)

(72) Inventors: Charles Parkhurst, Murphy, TX (US); Jay Lundy, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 763 days.

(21) Appl. No.: 18/088,096

(22) Filed: Dec. 23, 2022

(65) Prior Publication Data

US 2024/0213931 A1 Jun. 27, 2024

(51) Int. Cl.
*H03F 3/45* (2006.01)
*G01R 15/20* (2006.01)
*H03F 3/04* (2006.01)

(52) U.S. Cl.
CPC ............. *H03F 3/04* (2013.01); *G01R 15/202* (2013.01); *H03F 3/45968* (2013.01); *H03F 2200/165* (2013.01); *H03F 2200/171* (2013.01); *H03F 2200/261* (2013.01)

(58) Field of Classification Search
CPC ................. H03F 3/04; H03F 2200/165; H03F 2200/171; H03F 2200/261; H03F 3/387; H03F 3/45286; H03F 1/26; G01R 15/202; G01R 33/0041; G01R 33/075; H03K 19/01825
USPC ........................................................ 330/291
See application file for complete search history.

(56) References Cited

U.S. PATENT DOCUMENTS 7,190,227 B2 * 3/2007 Gilbert ................ H03G 1/0023 330/254
2003/0102909 A1 * 6/2003 Motz .................... G01R 33/075 330/9
2020/0011940 A1 1/2020 Motz

* cited by examiner

*Primary Examiner* — Andrea Lindgren Baltzell
*Assistant Examiner* — Khiem D Nguyen
(74) *Attorney, Agent, or Firm* — Xianghui Huang; Frank D. Cimino

(57) ABSTRACT

An electronic system includes a bipolar junction transistor (BJT) input stage circuit having a first BJT input, a second BJT input, a first BJT output, a second BJT output, and a BJT voltage input. An amplifier has a first amplifier input, a second amplifier input, and an amplifier output. The first amplifier input is coupled to the first BJT output and the second amplifier input is coupled to the second BJT output. The second BJT input is coupled to the amplifier output. A base current compensator has a first base compensator output, a second base compensator output, and a base compensator voltage output. The first base compensator output is coupled to the first BJT input and the second base compensator output is coupled to the second BJT input. The base compensator voltage output is coupled to the BJT voltage input.

21 Claims, 8 Drawing Sheets

TO FIG. 6B

600
CLOCK CIRCUIT 302
CLKIT
CLKIB
CLK
CHOP
103
102
610
602
604
414a
414b
416a
416b
136
134
130a
105a
224a
121a
120a
108a
212
210
214
216
218a
218b
218c
218d
218e
208a
101a
101b
304
418a
420a
634
402
404a
404b
404c
404d
406a
406b
406c
406d
408
410

FROM FIG. 6A
622
624
628
626
632
112
614
618
612
616
620
630
411
606
414c
118
208b
416c
120b
210
608
414d
636
418b
218b
214
218a
216
416d
420b
218c
218e
218d
121b
224b
212
130b
105b
108b
306

INSTRUMENTATION AMPLIFIER WITH BASE CURRENT COMPENSATOR FOR IMPROVED PERFORMANCE

BACKGROUND

An instrumentation amplifier is an electrical circuit that is designed to receive an input signal and provide an output signal that is based on the input signal and that has a large gain. Instrumentation amplifiers are used with devices, such as Hall sensors, that may provide a relatively low input signal and operate with relatively high noise levels. An instrumentation amplifier may be found in DC electric motors, automobile electronics, as well as in other applications.

SUMMARY

An electronic system includes a bipolar junction transistor (BJT) input stage circuit having a first BJT input, a second BJT input, a first BJT output, a second BJT output, and a BJT voltage input. An amplifier has a first amplifier input, a second amplifier input, and an amplifier output. The first amplifier input is coupled to the first BJT output and the second amplifier input is coupled to the second BJT output. The second BJT input is coupled to the amplifier output. A base current compensator has a first base compensator output, a second base compensator output, and a base compensator voltage output. The first base compensator output is coupled to the first BJT input and the second base compensator output is coupled to the second BJT input. The base compensator voltage output is coupled to the BJT voltage input.

An electronic system includes an instrumentation amplifier having a first input, a second input, a first output, and a second output. The instrumentation amplifier includes a first amplifier path extending from the first input to the first output. The first amplifier path includes a first modulator, a first bipolar junction transistor (BJT) input stage circuit, a first demodulator, and a first amplifier arranged in series on the first amplifier path. A second amplifier path extends from the second input to the second output. The second amplifier path includes a second modulator, a second BJT input stage circuit, a second demodulator, and a second amplifier arranged in series on the second amplifier path. A base current compensator includes first base compensator outputs coupled to inputs of the first BJT input stage circuit and second base compensator outputs coupled to inputs of the second BJT input stage circuit. A first BJT voltage input of the first BJT input stage circuit and a second BJT voltage input of the second BJT input stage circuit are coupled to a base compensator voltage output of the base current compensator.

An electronic system includes an instrumentation amplifier including a first amplifier path and a base current compensator. The first amplifier path extends between a first input and a first output of the instrumentation amplifier. The first amplifier path includes a modulator having an input corresponding to the first input, a bipolar junction transistor (BJT) input stage circuit having an input coupled to an output of the modulator, a demodulator having an input coupled to an output of the BJT input stage circuit, and an amplifier having an input coupled to an output of the demodulator and an output corresponding to the first output. A BJT voltage input of the BJT input stage circuit is coupled to a base compensator voltage output of the base current compensator. The base current compensator is configured to generate and provide a control signal to the BJT voltage input. The base current compensator is configured to provide a modulated input current to the input of the BJT input stage circuit based on the control signal.

DETAILED DESCRIPTION

Figure 1:
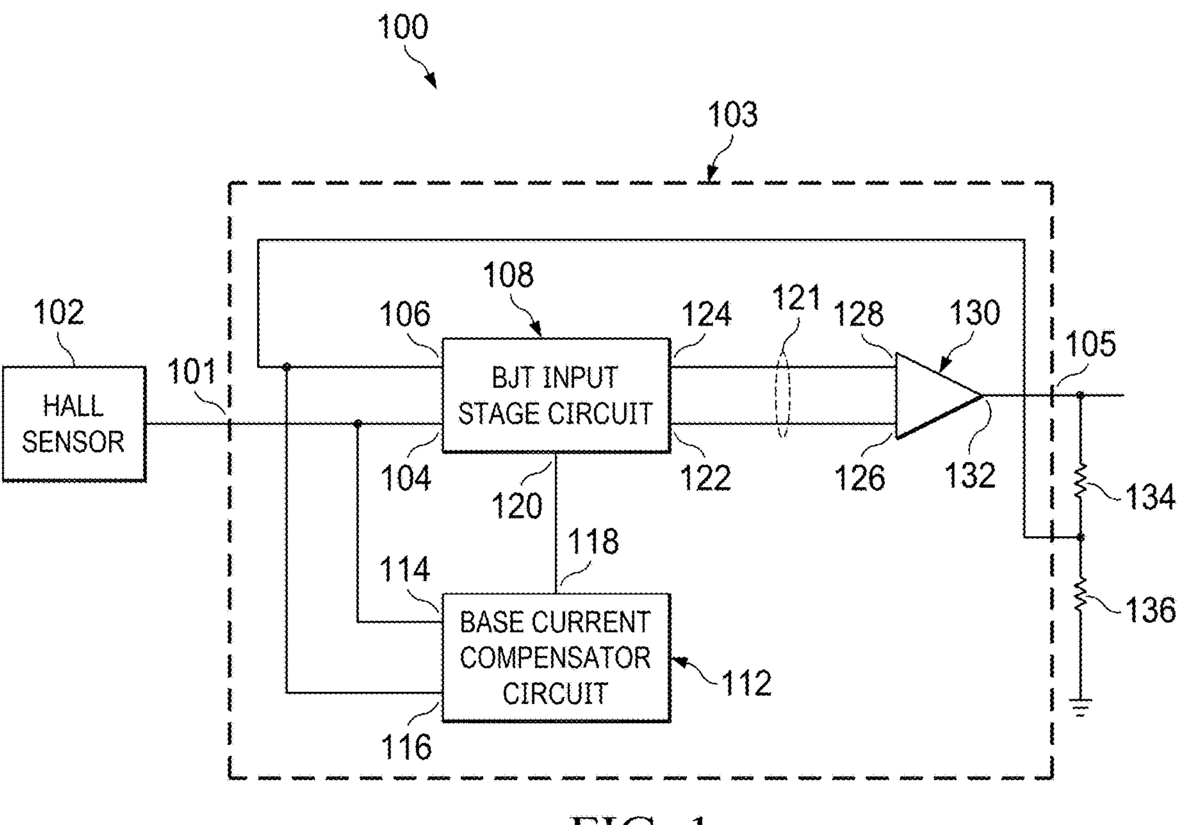
FIG. 1 illustrates a block diagram of an electronic system including an instrumentation amplifier having a base current compensator circuit in accordance with some examples.

The following description provides many different examples for implementing different features of the provided subject matter. Specific examples of components and arrangements are described below to simplify the present description. In the drawings, corresponding numerals and symbols generally refer to corresponding parts unless otherwise indicated. The drawings are not drawn to scale.

FIG. 1 depicts an electronic system 100 in accordance with some examples. The electronic system 100 includes a Hall sensor 102, an instrumentation amplifier 103, a first resistor 134, and a second resistor 136. The instrumentation amplifier 103 includes a bipolar junction transistor (BJT) input stage circuit 108, a base current compensator circuit 112, and an amplifier 130. The BJT input stage circuit 108 comprises a first BJT input 104, a second BJT input 106, a first BJT output 122, a second BJT output 124, and a BJT voltage input 120. The amplifier 130 comprises a first amplifier input 126, a second amplifier input 128, and an amplifier output 132. The first BJT input 104 corresponds to an input 101 of the instrumentation amplifier 103 and the amplifier output 132 corresponds to an output 105 of the instrumentation amplifier 103. Resistors 134 and 136 are coupled in series between the amplifier output 132 and ground to form a voltage divider. The node between resistors 134 and 136 is coupled to the second BJT input 106. A feedback signal that is proportional to, and indicative of, an amplified output signal at output 105 is input to BJT input stage circuit 108 at the second BJT input 106. The amplified output signal is sometimes simply referred to as output signal.

The Hall sensor 102 is configured to provide a sensor signal indicative of a magnetic field measured by the Hall sensor 102, to the input 101 of the instrumentation amplifier 103. The BJT input stage circuit 108 is configured to generate a first stage output signal 121 based on the sensor signal provided at the first BJT input 104 and the feedback signal provided at the second BJT input 106. Typically, the sensor signal provided by the Hall sensor 102 is relatively small (e.g., in the millivolt or microvolt range) and the first stage output signal 121 generated by the BJT input stage circuit 108 amplifies the relatively small sensor signal such that the first stage output signal 121 is within an acceptable range for the amplifier 130. The first stage output signal 121 is a differential signal that is provided to the first amplifier input 126 and the second amplifier input 128. The amplifier 130 is configured to generate the amplified output signal based on the differential components of the first stage output signal 121 and a selected gain. Thus, the electronic system 100 is configured to generate a senor signal indicating a sensed magnetic field having amplitude and phase components and convert the sensor signal to an amplified output signal at the output 105 of the instrumentation amplifier 103 for further downstream processing.

The BJT input stage circuit 108 comprises one or more BJTs (e.g., first and second BJTs 210 and 212 of FIG. 2) configured to receive an input signal at control terminals (i.e., base terminals) of the BJTs. Utilizing BJTs at the input stage of the instrumentation amplifier 103 reduces noise in the output signal at the output 105 because BJTs have faster switching speeds, lower thermal noise, lower flicker noise, and higher gain compared to other transistors. For example, an amplifier implementing metal-oxide-semiconductor field-effect transistors (MOSFETs) to receive the input signal at the input stage have higher noise due to higher capacitance at the control terminals (i.e., the gates) of the MOSFETs. This noise may manifest as a DC offset in a first stage output signal produced by the MOSFET based input stage that may be greater than a magnitude of the sensor signal, thereby making it difficult to differentiate between the DC offset introduced by the MOSFETs and the sensor signal in downstream processing. However, while the BJTs provide a faster switching speed, lower thermal noise, lower flicker noise, and higher gain compared to other transistors (e.g., MOSFETs) that could be utilized in the input stage, the BJTs may introduce a base current that may manifest as a DC offset in the output signal.

Accordingly, one can see that some examples of the present disclosure make use of the base current compensator circuit 112 that is configured to mitigate effects of the base current introduced by the BJT input stage circuit 108. The base current compensator circuit 112 comprises a base compensator voltage output 118, a first base compensator output 114, and a second base compensator output 116. The base current compensator circuit 112 is configured to generate a control signal at a base compensator voltage output 118, which is provided to the BJT voltage input 120. The base current compensator circuit 112 is configured to provide input current at the first BJT input 104 and the second BJT input 106 based on the control signal. The input current provided by the base current compensator circuit 112 is configured to match the base current of the BJTs of the BJT input stage circuit 108. The input current modulates current at the first and second BJT inputs 104, 106, thereby "tuning" a DC offset induced by the base currents of the BJTs of the BJT input stage circuit 108. The DC offset may be filtered out of the output signal by downstream processing (e.g., by a filter). As a result, this approach improves a performance of the instrumentation amplifier 103 by providing faster switching speeds, higher input stage gain, lower flicker noise, and lower thermal noise while compensating for leakage current (e.g., base current) and mitigating issues with other input stage circuits that utilize MOSFETs. Thus, DC offset variations due to base current in the BJTs of the BJT input stage circuit 108 are reduced while producing a more accurate output signal at the output 105 of the instrumentation amplifier 103.

Figure 2:
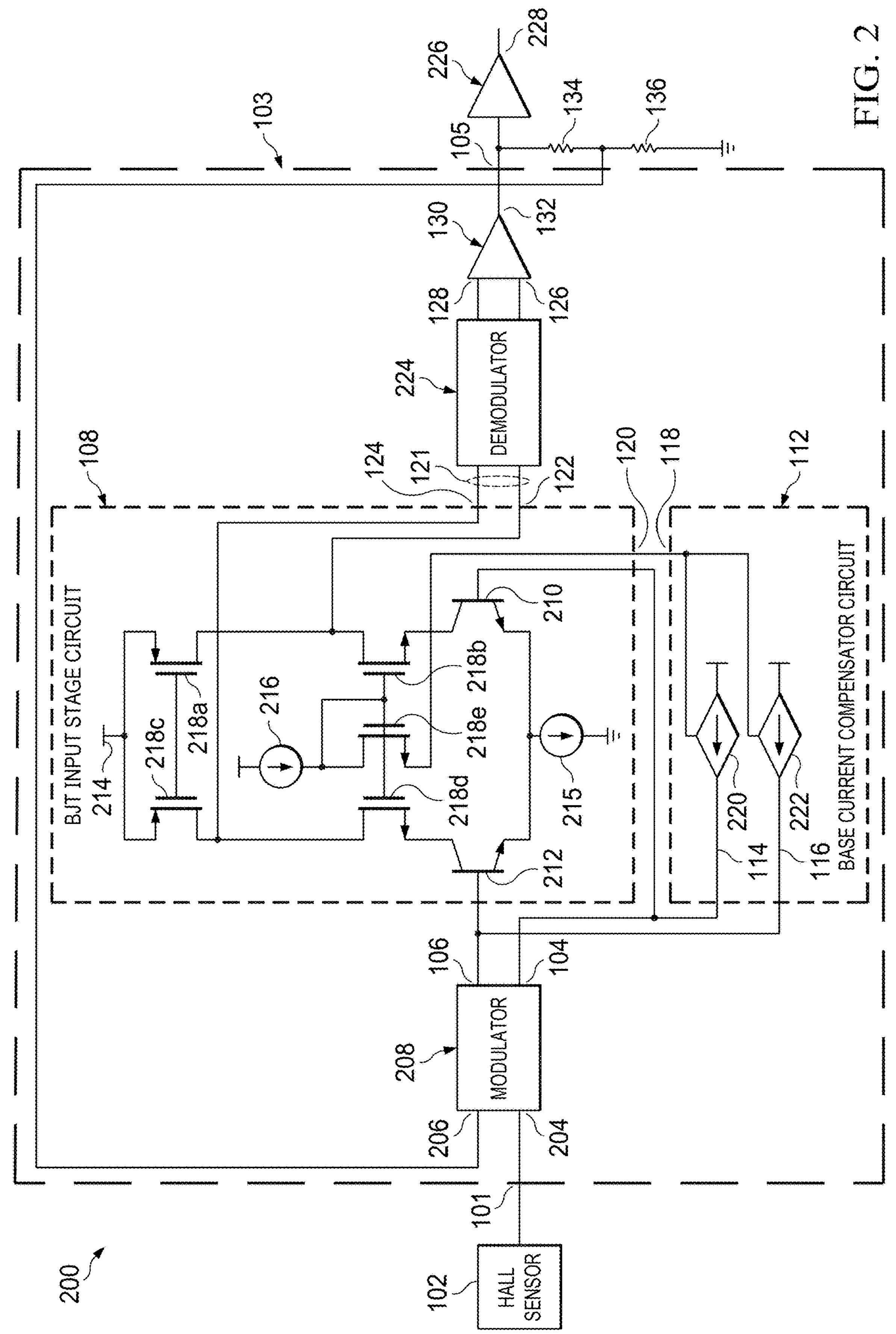
FIG. 2 illustrates a block diagram of an electronic system including an instrumentation amplifier having a base current compensator circuit in accordance with some examples.

FIG. 2 provides a more detailed example of an electronic system 200 including a base current compensator circuit 112 coupled to a first BJT input 104 and a second BJT input 106 of a BJT input stage circuit 108. Accordingly, the features explained above with regards to FIG. 1 are consistent with some examples of the electronic system 200 in FIG. 2 (and vice versa).

The electronic system 200 includes a Hall sensor 102, an instrumentation amplifier 103, a filter 226, a first resistor 134, and a second resistor 136. The instrumentation amplifier 103 includes a modulator 208, a BJT input stage circuit 108, a base current compensator circuit 112, a demodulator 224, and an amplifier 130. The Hall sensor 102 is configured to provide a sensor signal to an input 101 of the instrumentation amplifier 103. The sensor signal is indicative of a magnetic field measured by the Hall sensor 102. The instrumentation amplifier 103 is configured to provide an output signal at an output 105 based on the sensor signal.

The sensor signal is provided at a first modulator input 204 of the modulator 208, and a feedback signal taken from the node between resistors 134 and 136 is provided at a second modulator input 206 of the modulator 208. The modulator 208 is configured to modulate the received sensor signal and the feedback signal and provide a modulated signal to first and second BJT inputs 104, 106 of the BJT input stage circuit 108. The BJT input stage circuit 108 is configured to receive the modulated signal and generate a first stage output signal 121. In some instances, the BJT input stage circuit 108 may be configured as a transconductance amplifier and may convert the modulated signal from a voltage signal into a current signal. First and second BJT outputs 122, 124 of the BJT input stage circuit 108 are coupled to inputs of the demodulator 224. The demodulator 224 is configured to receive and demodulate the first stage output signal 121 and provide a demodulated signal to the first and second amplifier inputs 126, 128 of the amplifier 130. The amplifier 130 receives the demodulated signal and applies a selected gain to generate the output signal at the amplifier output 132. The output signal of the amplifier 130 is provided to a first filter input of the filter 226. The filter 226 is configured to apply a selected filter to the output signal of the instrumentation amplifier 103 and generate a filtered output signal at the filter output 228.

In some instances, the output signal on output 105 may comprise an overall offset error due to components of the Hall sensor 102 and/or components of the instrumentation amplifier 103. For example, a first DC offset may be added to the sensor signal generated by the Hall sensor 102 and a second DC offset may be added to the sensor signal by the instrumentation amplifier 103, where the first and second DC offsets are present as an overall offset error in the output signal generated by the instrumentation amplifier 103. The modulator 208 and the demodulator 224 may transform a DC error (e.g., the second DC offset) into an AC error that may be filtered by the filter 226, such that the filtered output signal at the filter output 228 comprises less error than the output signal at output 105. The modulator 208 and the demodulator 224 may respectively comprise a plurality of chopping switches that are driven by a chopper clock signal. The modulator 208 is configured to chop the sensor signal received at input 204 and feedback signal received at input 206 at a chop frequency that corresponds to a frequency of the chopper clock signal. Further, in some instances, the modulator 208 may chop the sensor signal and the feedback signal at the chop frequency with a defined DC offset. The demodulator 224 is configured to chop the received first stage output signal 121 at the chop frequency and generate the demodulated signal. Because at least a portion of the second DC offset may be introduced in between the modulator 208 and the demodulator 224 (e.g., by the BJT input stage circuit 108), the second DC offset may be filtered by the filter 226, thereby reducing the overall offset error in the filtered output signal on filter output 228.

The BJT input stage circuit 108 may, for example, comprise a plurality of transistors 218*a-c*, current sources 215, 216, a first BJT 210, and a second BJT 212. It will be appreciated that while the first and second BJTs 210, 212 are configured as NPN transistors, this is merely a non-limiting example and the first and second BJTs 210, 212 may be configured as PNP transistors in other examples of the BJT input stage circuit 108. The plurality of transistors 218*a-e* comprises a first transistor 218*a*, a second transistor 218*b*, a third transistor 218*c*, a fourth transistor 218*d*, and a fifth transistor 218*e*. In some instances, the transistors 218*a-e* are configured as MOSFETs or some other suitable transistor. The first and second transistors 218*a*, 218*b* are coupled in series along a first path of the BJT input stage circuit 108 between a voltage terminal 214 and the first BJT 210. The third and fourth transistors 218*c*, 218*d* are coupled in series along a second path of the BJT input stage circuit 108 between the voltage terminal 214 and the second BJT 212. Gates of the first and third transistors 218*a*, 218*c* are coupled together. Further, the current source 216 is configured to bias gates of the second, fourth, and fifth transistors 218*b*, 218*d*, 218*c*. A base of the first BJT 210 is coupled to the first BJT input 104, a collector of the first BJT 210 is coupled to a source/drain region of the second transistor 218*b*, and an emitter of the first BJT 210 is coupled to the current source 215. A base of the second BJT 212 is coupled to the second BJT input 106, a collector of the second BJT 212 is coupled to a source/drain region of the fourth transistor 218*d*, and an emitter of the second BJT 212 is coupled to the current source 215.

During operation of the BJT input stage circuit 108, a first voltage provided to the first BJT input 104 (e.g., corresponding to the sensor signal) is applied to the base of the first BJT 210. This results in the first BJT 210 generating a corresponding first current across the first path of the BJT input stage circuit 108 (e.g., between the collector and emitter of the first BJT 210). Further, a second voltage provided to the second BJT input 106 (e.g., corresponding to the feedback signal) is applied to the base of the second BJT 212. As a result, the second BJT 212 generates a corresponding second current across the second path of the BJT input stage circuit 108 (e.g., between the collector and emitter of the second BJT 212). The first and second currents correspond to the first stage output signal 121 provided at the first and second BJT outputs 122, 124. As the first and second voltages at bases of the first and second BJTs 210, 212 increase, the first and second currents increase based on a gain of the BJT input stage circuit 108. In addition, the first and second currents across the first and second paths of the BJT input stage circuit 108 each comprise at least a portion of a base current from a corresponding one of the first and second BJTs 210, 212. In some instances, the base current injected along the first path or second path may be at least one tenth of a percent, one percent, ten percent, or some other suitable percentage of the overall current along the first path or second path.

Furthermore, the base current compensator circuit 112 is configured to provide a control signal (e.g., a voltage signal) to a BJT voltage input 120 of the BJT input stage circuit 108. The second and fourth transistors 218*b*, 218*d* are configured to fix voltages at collectors of the first and second BJTs 210, 212 based on the control signal provided by the base current compensator circuit 112. Thus, the BJT input stage circuit 108 is configured to generate the first stage output signal 121 based on voltages applied to bases of the first and second BJTs 210, 212 and the control signal provided by the base current compensator circuit 112.

The base current compensator circuit 112 is coupled between the BJT voltage input 120 and the first and second BJT inputs 104, 106 along an input stage feedback path. The base currents of the first and second BJTs 210, 212 injected along the first and second paths of the BJT input stage circuit 108 may be present in the second DC offset of the output signal on 105. The base current compensator circuit 112 is configured to provide a modulated input current at the first and second BJT inputs 104, 106 based on the control signal, where the modulated input current may be filtered out downstream (e.g., by the filter 226) thereby mitigating the DC offset introduced by the base currents of the first and second BJTs 210, 212. In various aspects, the modulated input current is based on (e.g., matched to) the base currents of the first and second BJTs 210, 212 and is configured to reduce the overall offset error in the output signal on 105. In some aspects, the base current compensator circuit 112 comprises a first controlled current source 220 that may provide a first modulated input current to the first BJT input 104 and a second controlled current source 222 that may provide a second modulated input current to the second BJT input 106. The first and second modulated input currents are generated based on the control signal and are modulated at a first frequency different from the chop frequency. The first and second modulated input currents provided at the first and second BJT inputs 104, 106 may be filtered out at the filter 226 based on the first frequency, thereby mitigating or removing the DC offset introduced by the base currents of the first and second BJTs 210, 212 at the filtered output signal on filter output 228.

Figure 3:
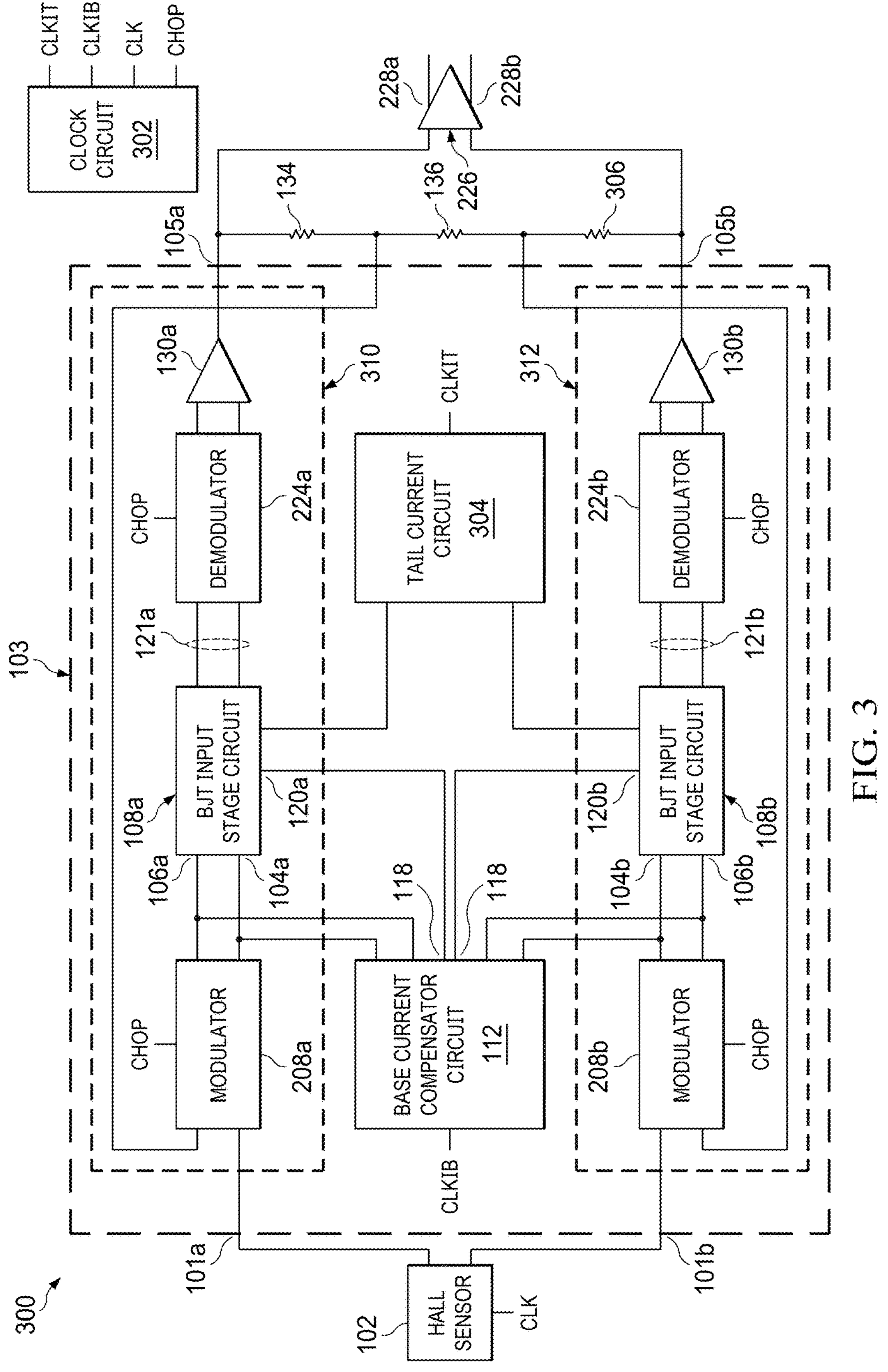
FIG. 3 illustrates a block diagram of an electronic system including an instrumentation amplifier having a base current compensator circuit and a tail current circuit in accordance with some examples.

FIG. 3 depicts an electronic system 300 in accordance with some examples. The electronic system 300 includes a Hall sensor 102, an instrumentation amplifier 103, a first resistor 134, a second resistor 136, a third resistor 306, a filter 226, and a clock circuit 302. In some aspects, the Hall sensor 102 may be configured as a spinning Hall sensor comprising two or more spinning phases, which can correspond to two or more different current directions across a Hall plate of the spinning Hall sensor. Accordingly, the Hall sensor 102 is configured to provide a differential sensor signal, corresponding to a magnetic field measured by the Hall sensor 102, to inputs 101*a*, 101*b* of the instrumentation amplifier 103. The instrumentation amplifier 103 is configured to provide an output signal at outputs 105*a* and 105*b* based on the sensor signal at 101*a* and 101*b*. In the example of FIG. 3, resistors 134, 136 and 306 are coupled across the outputs 105*a* and 105*b* to provide first and second feedback signals, the first feedback signal taken at the node between resistors 134 and 136 and the second feedback signal taken at the node between resistors 136 and 306.

In some aspects, the instrumentation amplifier 103 includes a first amplifier path 310, a second amplifier path 312, a base current compensator circuit 112, and a tail current circuit 304, where the first and second amplifier paths 310, 312 extend in parallel with one another. The first amplifier path 310 can include a modulator 208*a*, a BJT input stage circuit 108a, a demodulator 224a, and an amplifier 130a. The second amplifier path 312 can include a modulator 208b, a BJT input stage circuit 108b, a demodulator 224b, and an amplifier 130b. It will be appreciated that the features explained above with regards to FIGS. 1 and 2 are consistent with some examples of the electronic system 300 in FIG. 3 (and vice versa). For example, the modulators 208a, 208b can each be an example of the modulator 208, the BJT input stage circuits 108a, 108b can each be an example of the BJT input stage circuit 108, the demodulators 224a, 224b can each be an example of the demodulator 224, and the amplifiers 130a, 130b can each be an example of the amplifier 130. Further, the clock circuit 302 is configured to generate a plurality of clock signals for components of the electronic system 300. For example, the clock circuit 302 may generate a sensor clock signal CLK provided to the Hall sensor 102, a chopping clock signal CHOP provided to the modulators 208a, 208b and the demodulators 224a, 224b, a base current clock signal CLKIB provided to the base current compensator circuit 112, and a tail current clock signal CLKIT provided to the tail current circuit 304.

With reference to the first amplifier path 310, the sensor signal at 101a and the first feedback signal are provided to inputs of the modulator 208a. The modulator 208a is configured to modulate the received sensor signal and output signal at a chop frequency of the chopping clock signal CHOP and provide a modulated signal to BJT inputs 104a, 106a of the BJT input stage circuit 108a. The BJT input stage circuit 108a is configured to receive the modulated signal and generate a first stage output signal 121a provided to the demodulator 224a. The demodulator 224a is configured to receive and demodulate the first stage output signal 121a and provide a demodulated signal to the amplifier 130a. The amplifier 130a receives the demodulated signal and applies a selected gain to generate the output signal at the output 105a.

With reference to the second amplifier path 312, the sensor signal at 101b and the second feedback signal at 105b are provided to inputs of the modulator 208b. The modulator 208b is configured to modulate the received sensor signal and output signal at the chop frequency of the chopping clock signal CHOP and provide a modulated signal to BJT inputs 104b, 106b of the BJT input stage circuit 108b. The BJT input stage circuit 108b is configured to receive the modulated signal and generate a first stage output signal 121b provided to the demodulator 224b. The demodulator 224b is configured to receive and demodulate the first stage output signal 121b and provide a demodulated signal to the amplifier 130b. the amplifier 130b receives the demodulated signal and applies a selected gain to generate the output signal at the output 105b. The output signal at 105a and 105b is provided to the filter 226. The filter 226 is configured to apply a selected filter to the output signal of the instrumentation amplifier 103 and generate a filter output signal at the filter outputs 228a, 228b.

The BJT input stage circuits 108a, 108b each comprise one or more BJTs (e.g., each comprise a first BJT and a second BJT as illustrated and/or described in FIG. 2 above) configured to receive input signals at control terminals (e.g., base terminals) of the BJTs. The BJTs reduce noise (e.g., thermal noise) in the output signal at 105a and 105b and have faster switching speeds and higher gains compared to other transistors, but introduces base currents along both the first and second amplifier paths 310, 312 of the instrumentation amplifier 103 that may manifest as a DC offset in the output signal at 105a and 105b. While BJTs of the BJT input stage circuits 108a. 108b may have the same design parameters during fabrication, due to limitations in fabrication tools doping concentrations and/or sizes of BJTs in the BJT input stage circuits 108a, 108b may vary. As a result, the base current along the first amplifier path 310 may be different from the base current along the second amplifier path 312. Thus, the DC offset present in the output signal at 105a due to the base current along the first amplifier path 310 may be different from the DC offset present in the output signal at 105b due to the base current along the second amplifier path 312.

Accordingly, examples of the present disclosure make use of the base current compensator circuit 112 to mitigate effects of the base currents along the first and second amplifier paths 310, 312. The base current compensator circuit 112 is configured to generate a control signal at a base compensator voltage output 118, which control signal is provided to BJT voltage inputs 120a, 120b. The base current compensator circuit 112 is configured to generate modulated input current at the BJT inputs 104a, 106a of the BJT input stage circuit 108a and the BJT inputs 104b, 106b of the BJT input stage circuit 108b based on the control signal provided to the BJT voltage inputs 120a, 120b. The input current provided by the base current compensator circuit 112 is configured to match the base currents of the BJTs of the BJT input stage circuits 108a, 108b and are configured to account for the difference in base currents across the first amplifier path 310 and the second amplifier path 312. Further, the input current provided by the base current compensator circuit 112 is modulated by a first frequency of the base current clock signal CLKIB such that the DC offset present in the output signal at 105a and 105b may be filtered out in downstream process (e.g., at the filter 226). Thus, DC offset variation due to base currents across the first and second amplifier paths 310, 312 is reduced while producing a more accurate output signal at the outputs 105a, 105b of the instrumentation amplifier 103.

A bias current applied to the Hall sensor 102 may be modulated by a second frequency of the sensor clock signal CLK. By modulating the bias current with the second frequency, a DC offset generated by the Hall sensor 102 may be reduced. In some aspects, the second frequency of the sensor clock signal CLK may be equal to the first frequency of the base current clock signal CLKIB, where the base current clock signal CLKIB is phase shifted (e.g., by 90 degrees) relative to the sensor clock signal CLK. Modulating the input current provided by the base current compensator circuit 112 by the first frequency that is equal to the second frequency and phase shifted facilitates effectively filtering out the DC offset from the base currents of the BJT input stage circuits 108a, 108b at the filter 226.

Further, the tail current circuit 304 is coupled to a tail current output of the BJT input stage circuit 108a and a tail current output of the BJT input stage circuit 108b. In some aspects, the tail current circuit 304 is configured to selectively sink a select amount of current from the BJTs of the BJT input stage circuits 108a, 108b, thereby facilitating the BJTs of each BJT input stage circuit 108a. 108b amplifying a difference of the input signals at control terminals (e.g., base terminals) of the BJTs. Tail current generated by the tail current circuit 304 may be modulated at a third frequency of the tail current clock signal CLKIT, where the third frequency is different from the first frequency. For example, the third frequency may be greater than the first frequency.

Figure 4A:
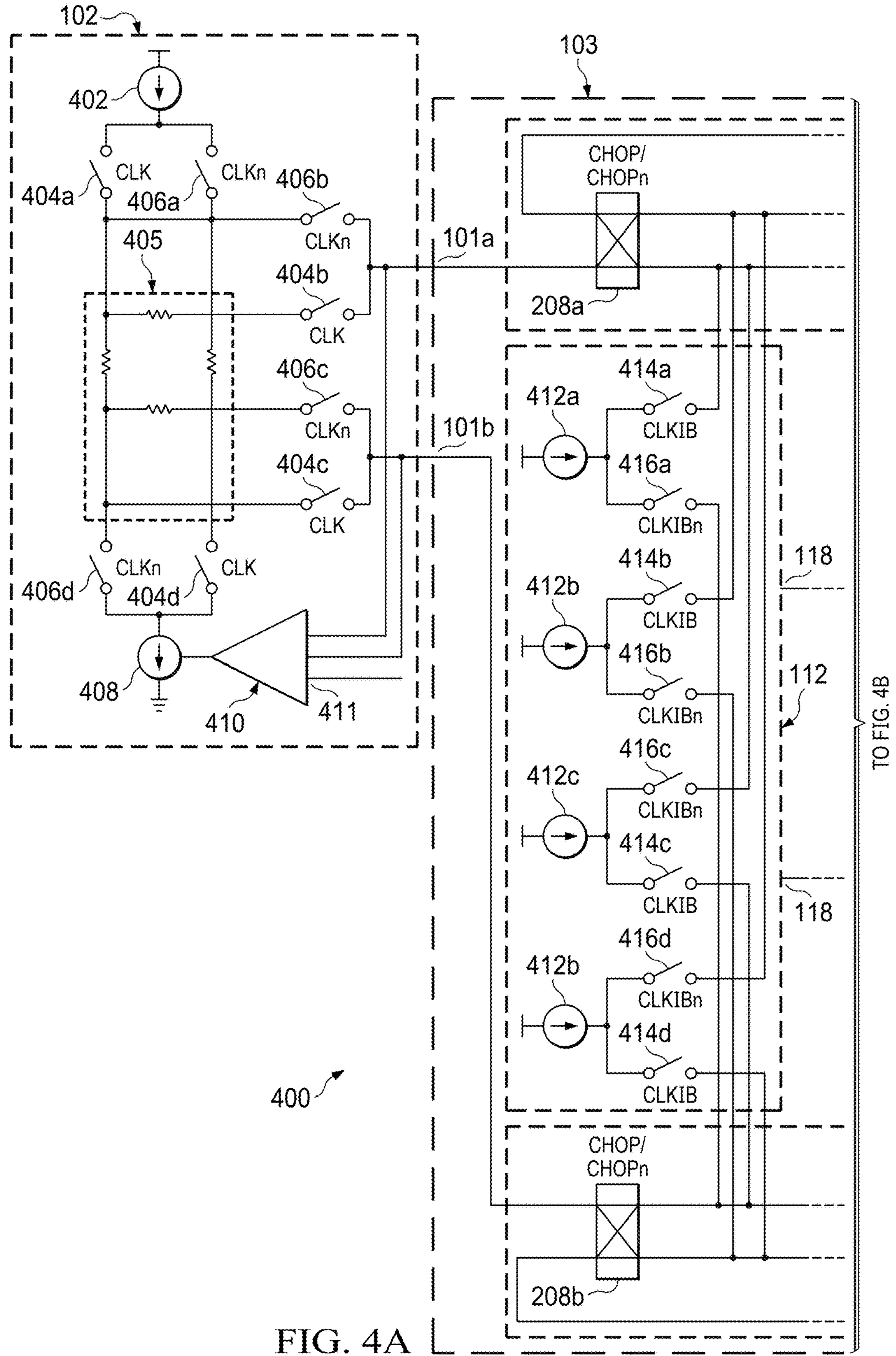
FIGS. 4A and 4B illustrate a block diagram of an electronic system including an instrumentation amplifier having a base current compensator circuit and a tail current circuit in accordance with some examples.
Figure 4B:
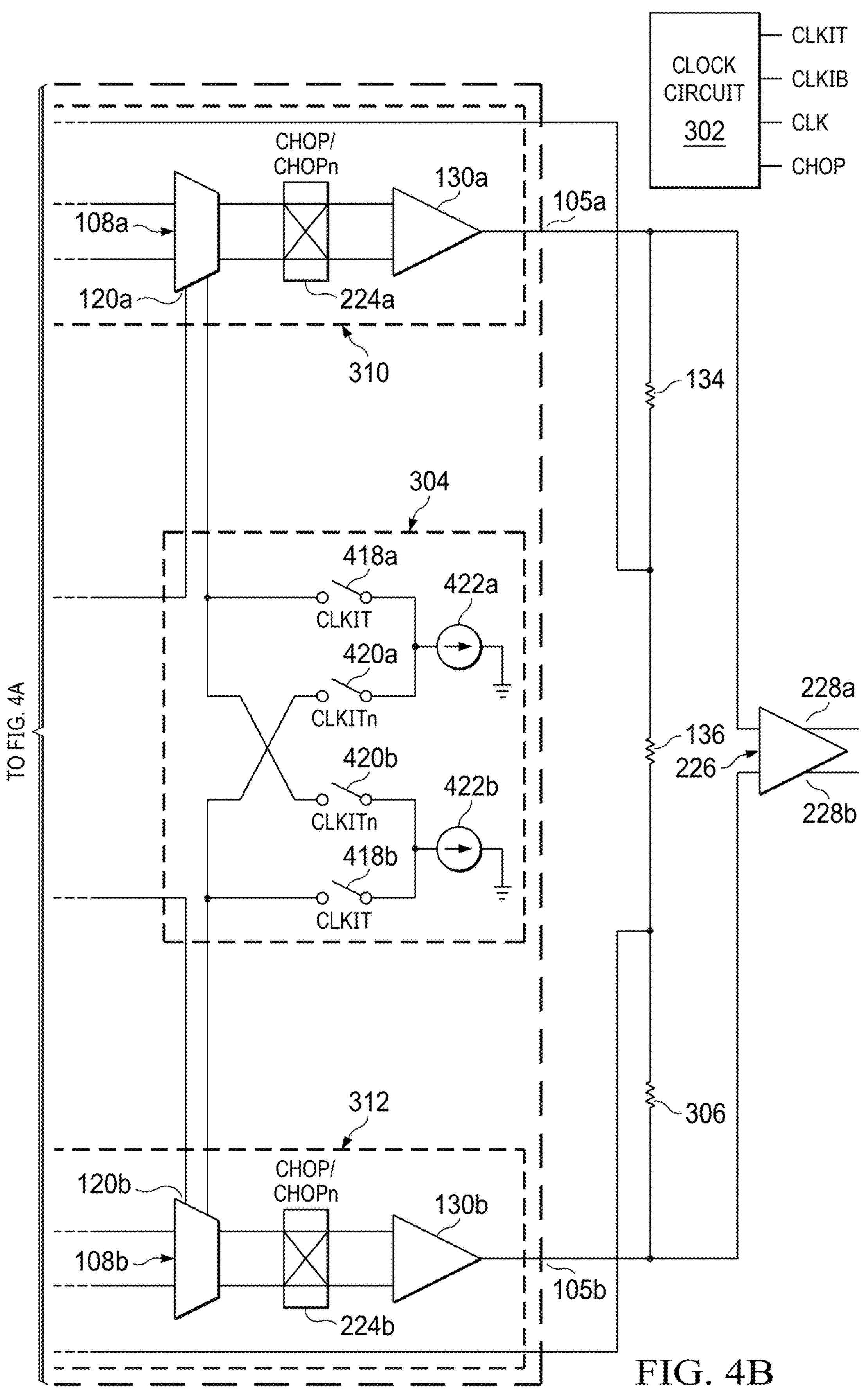

Referring now to FIGS. 4A and 4B, one can see another embodiment of an electronic system 400 comprising an instrumentation amplifier 103 and a Hall sensor 102 in accordance with some examples. It will be appreciated that the electric system 400 spans FIGS. 4A and 4B. In this example, a base current compensator circuit 112 of the instrumentation amplifier 103 may comprise a first plurality of current sources 412*a-d* and a tail current circuit 304 of the instrumentation amplifier 103 comprises a second plurality of current source 422*a-b*. It will be appreciated that the features explained above with regards to FIG. 3 are consistent with some examples of the electronic system 400 in FIGS. 4A and 4B (and vice versa).

The Hall sensor 102 comprises one or more Hall sensor plate(s) 405, which is typically a sheet of conductive material, such as a metal, and which is represented as a plurality of resistors. Further, the Hall sensor 102 comprises current sources 402, 408, a plurality of switches 404*a-d*, a plurality of switches 406*a-d*, and an amplifier 410. The switches 404*a-d* and 406*a-d* are coupled together as illustrated in FIGS. 4A and 4B and are configured to modulate a bias current applied by the current source 402 based on a sensor clock signal CLK provided by a clock circuit 302. This facilitates the Hall sensor 102 comprising two or more spinning phases, which can correspond to two or more different current directions across the one or more Hall sensor plate(s). In some aspects, control terminals of the switches 404*a-d* are gated by the sensor clock signal CLK and control terminals of the switches 406*a-d* are gated by an inverse of the sensor clock signal CLK (e.g., CLKn). Thus, a sensor signal generated by the Hall sensor 102 and provided at inputs 101*a*, 101*b* is modulated by the sensor clock signal CLK, such that a DC offset from components of the Hall sensor 102 may be filtered out in downstream process (e.g., at the filter 226). Non-inverting inputs of the amplifier 410 are coupled to outputs of the Hall sensor 102, and an inverting input 411 of the amplifier 410 is coupled to a common-mode voltage rail. An output of the amplifier 410 is provided to the current source 408 and configured to control a current generated by the current source 408. In some aspects, the amplifier 410 is configured to establish a common-mode voltage at 101*a* and 101*b*.

The first plurality of current sources 412*a-d* of the base current compensator circuit 112 are coupled to inputs of BJT input stage circuits 108*a*, 108*b* of the instrumentation amplifier 103. The base current compensator circuit 112 comprises a first plurality of switches 414*a-d* and a second plurality of switches 416*a-d* coupled between the first plurality of current sources 412*a-d* and inputs of the BJT input stage circuits 108*a*, 108*b*. Control terminals of the first plurality of switches 414*a-d* are gated by a base current clock signal CLKIB provided by clock circuit 302 and control terminals of the second plurality of switches 416*a-d* are gated by an inverse of the base current clock signal CLKIB (e.g., CLKIBn). In some aspects, input current biases provided by the first plurality of control source 412*a-d* are generated based on a control signal provided by the base current compensator circuit 112 to BJT voltage inputs 120*a*, 120*b* of the BJT input stage circuits 108*a*, 108*b*. Further, the first and second pluralities of switches 414*a-d*, 416*a-d* are configured to modulate the input current biases provided by the first plurality of control sources 412*a-d* at a first frequency of the base current clock signal CLKIB.

The tail current circuit 304 comprises a third plurality of switches 418*a-b* and a fourth plurality of switches 420*a-b* coupled between the second plurality of current sources 422*a-b* and tail current outputs of the BJT input stage circuits 108*a*, 108*b*. Control terminals of the third plurality of switches 418*a-b* are gated by a tail current clock signal CLKIT provided by the clock circuit 302 and control terminals of the fourth plurality of switches 420*a-b* are based by an inverse of the tail current clock signal CLKIT (e.g., CLKITn). The third and fourth pluralities of switches 418*a-b*, 420*a-b* are configured to modulate tail current biases provided by the second plurality of current sources 422*a-b* at a third frequency of the tail current clock signal CLKIT.

Figure 5:
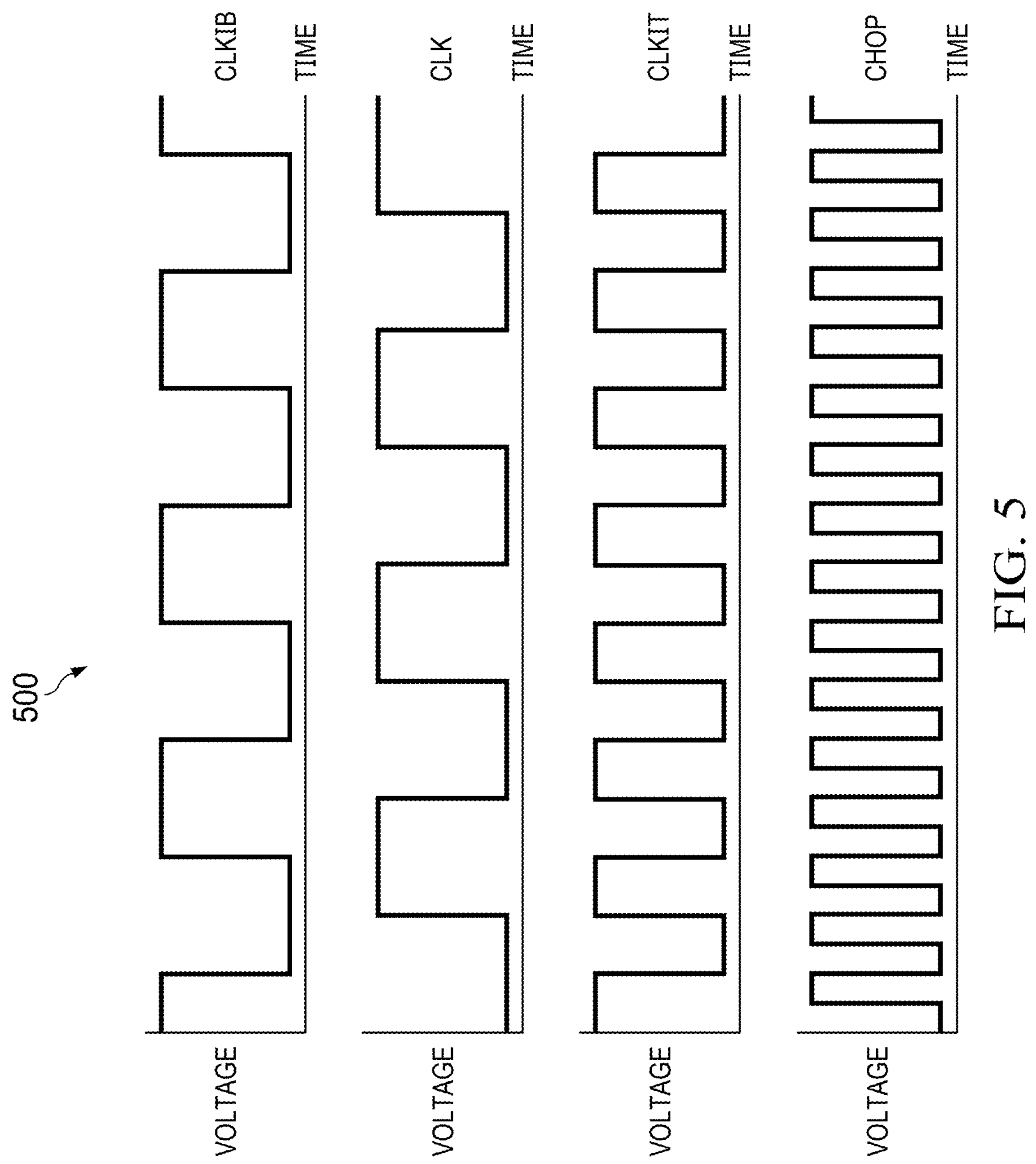
FIG. 5 illustrates a waveform diagram of some clock signals provided to components of an electronic system having an instrumentation amplifier and a Hall sensor in accordance with some examples.

Referring now to FIG. 5, one can see some sample waveforms 500 that depict clock signals provided to components of the Hall sensor (e.g., 102 of FIG. 104) and the instrumentation amplifier (e.g., 103 of FIG. 104). A base current clock signal CLKIB has a first frequency, a sensor clock signal CLK has a second frequency, a tail current clock signal CLKIT has a third frequency, and a chopping clock signal CHOP has a fourth frequency. In some aspects, the first frequency is equal to the second frequency, where the base current clock signal CLKIB is phase shifted (e.g., by 90 degrees) relative to the sensor clock signal CLK. Further, the third frequency is greater than the first and second frequencies, and the fourth frequency is greater than the third frequency.

Figure 6A:
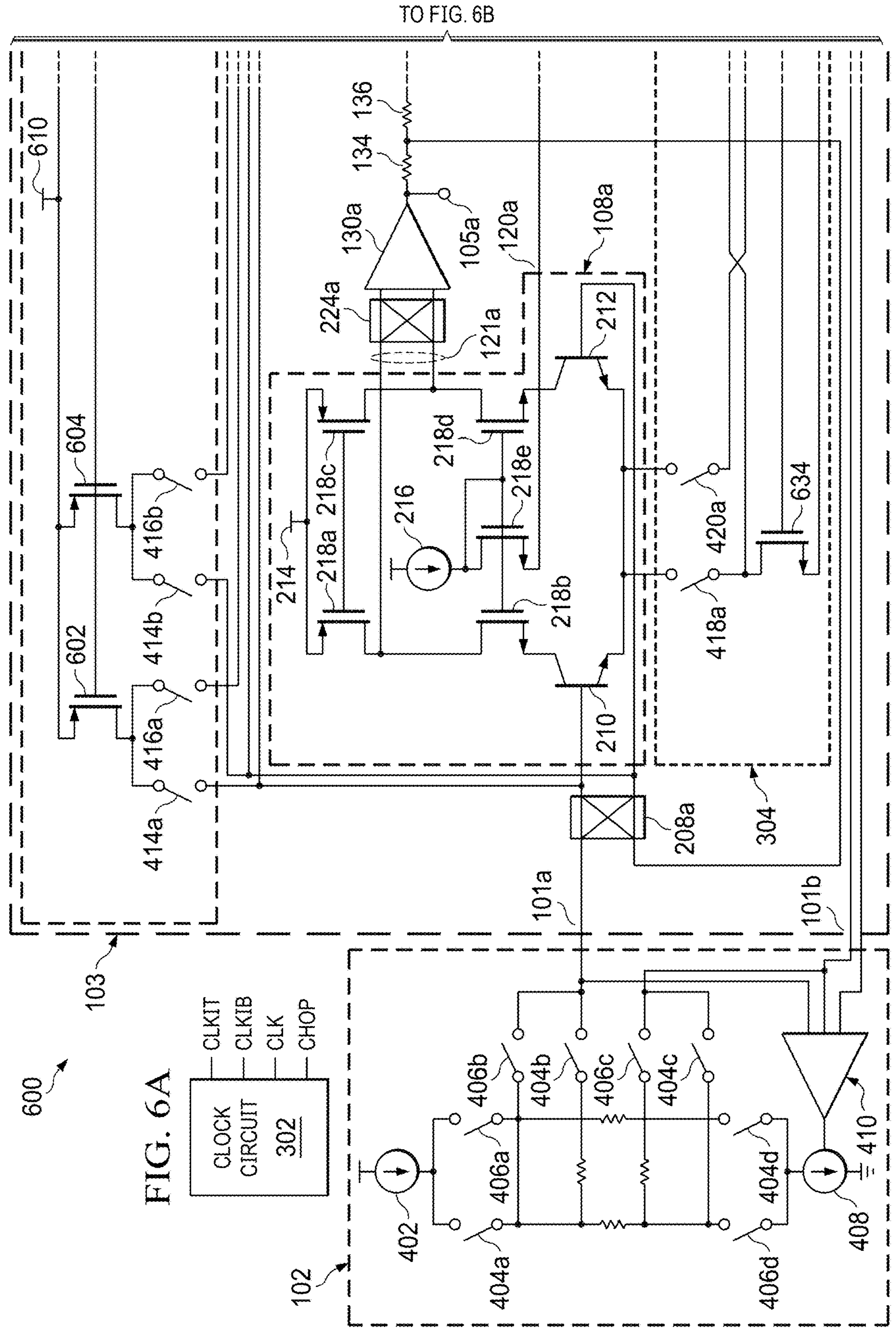
FIGS. 6A and 6B illustrate a circuit diagram of an electronic system including an instrumentation amplifier having a base current compensator circuit and a tail current circuit in accordance with some examples.
Figure 6B:
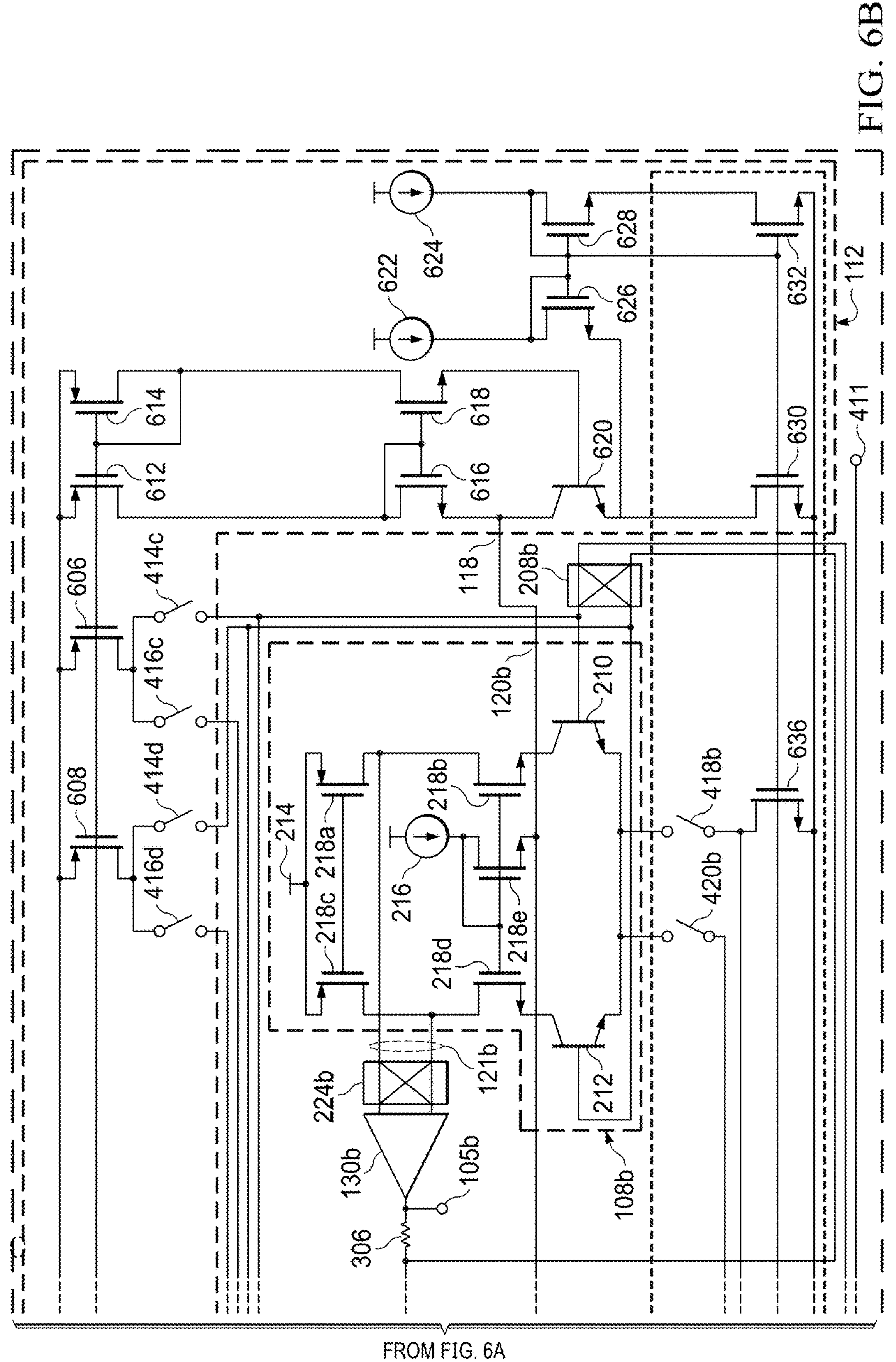

Turning now to FIGS. 6A and 6B, one can see a more detailed circuit schematic of an electronic system 600 comprising a Hall sensor 102 and an instrumentation amplifier 103 according to some examples of the present description. It will be appreciated that the electric system 600 spans FIGS. 6A and 6B. The instrumentation amplifier 103 includes modulators 208*a*, 208*b*, BJT input stage circuits 108*a*, 108*b*, demodulators 224*a*, 224*b*, amplifiers 130*a*, 130*b*, a base current compensator circuit 112, and a tail current circuit 304. The modulator 208*a*, BJT input stage circuit 108*a*, demodulator 224*a*, and amplifier 130*a* correspond to a first amplifier path of the instrumentation amplifier 103. Further, the modulator 208*b*, BJT input stage circuit 108*b*, demodulator 224*b*, and amplifier 130*b* correspond to a second amplifier path of the instrumentation amplifier 103. It will be appreciated that the features explained above with regards to FIGS. 1-4 can be consistent with some examples of the electronic system 600 in FIGS. 6A and 6B (and vice versa).

In some aspects, the BJT input stage circuits 108*a*, 108*b* are configured as the BJT input stage circuit 108 of FIG. 2 and each comprise a plurality of transistors 218*a-e*, a current source 216, a first BJT 210, and a second BJT 212. Fifth transistors 218*e* of the BJT input stage circuits 108*a*, 108*b* are respectively configured to receive a control signal from a base compensator voltage output 118 of the base current compensator circuit 112 at BJT voltage inputs 120*a*, 120*b* of the BJT input stage circuits 108*a*, 108*b*. In some aspects, the base current compensator circuit 112 comprises a first plurality of switches 414*a-d*, a second plurality of switches 416*a-d*, transistors 602, 604, 606, 608, 612, 614, 616, 618, 626, 628, 630, 632, current sources 622, 624, and a reference BJT 620. Control terminals of the first plurality of switches 414*a-d* are gated by a base current clock signal CLKIB provided by clock circuit 302 and control terminals of the second plurality of switches 416*a-d* are gated by an inverse of the base current clock signal CLKIB (e.g., CLKIBn). Further, transistors 602, 604, 606, 608 are coupled between a voltage terminal 610 and inputs of the BJT input stage circuits 108*a*, 108*b*.

The transistors 612, 614, 616, 618 are coupled between the reference BJT 620 and the transistors 602, 604, 606, 608. In some aspects, the transistors 612, 614, 616, 618 are configured as a current mirror are configured to provide an input current to the transistors 612, 614, 616, 618 based on a current across a collector and emitter of the reference BJT 620. In various aspects, the base compensator voltage output 118 is coupled to the collector of the reference BJT 620 such that voltages at the collectors of the first and second BJTs 210, 212 of the BJT input stage circuits 108*a*, 108*b* are equal and/or matched to the voltage at the collector of the reference BJT 620 (where the voltage at the collector of the reference BJT 620 corresponds to the control signal). Thus, the voltages at the collectors of the first and second BJTs 210, 212 of the BJT input stage circuits 108*a*. 108*b* are configured to match the voltage at the collector of the reference BJT 620. Further, the current across the collector and emitter of the reference BJT 620 is configured to match base currents of first and second BJTs 210, 212 of the BJT input stage circuits 108*a*, 108*b*. As a result, the input current injected by the transistors 612, 614, 616, 618 to the inputs of the BJT input stage circuits 108*a*, 108*b* is based on the control signals and is configured to match (e.g., be equal to) base currents of the first and second BJTs 210, 212 of the BJT input stage circuits 108*a*, 108*b*. Further, the first plurality of switches 414*a-d* and the second plurality of switches 416*a-d* are configured to modulate the bias input current injected by the transistors 612, 614, 616, 618, such that a DC offset in an output signal at 105*a*, 105*b* introduced by base currents of the first and second BJTs 210, 212 across the first and second amplifier paths of the instrumentation amplifier 103 may be filtered out in downstream processes (e.g., by a filter). Thus, by virtue of the base current compensator circuit 112 comprising the reference BJT 620, the base current compensator circuit 112 may inject a suitable modulated input current that matches base currents of the first and second BJTs 210, 212. Accordingly, DC offset due to base currents across the first and second amplifier paths of the instrumentation amplifier 103 is reduced while producing a more accurate output signal at the outputs 105*a*, 105*b* of the instrumentation amplifier 103.

The current sources 622, 624 and transistors 626, 628, 630, 632 are operably coupled as shown. In some aspects, the current sources 622, 624 and transistors 626, 628, 630, 632 are configured as a current sinkage circuit that is configured to selectively sink a select amount of current from the reference BJT 620 while the transistors 602, 604, 606, 608 inject the input current from the reference BJT 620 to inputs of the BJT input circuits 108*a*, 108*b*. As a result, the input current from the base current compensator circuit 112 injected on inputs of the BJT input circuits 108*a*, 108*b* is well-balanced.

Further, the tail current circuit 304 is coupled to tail current outputs of the BJT input stage circuits 108*a*, 108*b*. For example, the tail current circuit 304 is coupled to emitters of the first and second BJTs 210, 212 of both of the BJT input stage circuits 108*a*, 108*b*. The tail current circuit 304 comprises a third plurality of switches 418*a-b*, a fourth plurality of switches 420*a-b*, and transistors 634, 636. Control terminals of the third plurality of switches 418*a-b* are gated by a tail current clock signal CLKIT provided by the clock circuit 302 and control terminals of the fourth plurality of switches 420*a-b* are based by an inverse of the tail current clock signal CLKIT (e.g., CLKITn). Further, the transistors 634, 636 are operably coupled as shown, where control terminals (e.g., gates) of the transistors 634, 636 are coupled to control terminals of the transistors 630, 632. The tail current circuit 304 is configured to selectively sink a select amount of current from the first and second BJTs 210, 212 of both of the BJT input stage circuits 108*a*, 108*b* such that output currents generated at outputs of the BJT input stage circuits 108*a*, 108*b* properly correspond to voltages provided to inputs of the first and second BJTs 210, 212 and are balanced.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the term "terminal(s)" may be a node(s), interconnection(s), pin(s) and/or lead(s). Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, in some instances consistent with the teachings herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, any value given herein means +/−10 percent of the stated value, or, if the value is zero, a reasonable range of values around zero. Modifications are possible in the described examples, and other implementations are possible, within the scope of the claims.

What is claimed is:

1. An electronic system, comprising:

a bipolar junction transistor (BJT) input stage circuit having a first BJT input, a second BJT input, a first BJT output, a second BJT output, and a BJT voltage input;

an amplifier having a first amplifier input, a second amplifier input, and an amplifier output, wherein the first amplifier input is coupled to the first BJT output and the second amplifier input is coupled to the second BJT output, and wherein the second BJT input is coupled to the amplifier output; and a base current compensator having a first base compensator output, a second base compensator output, and a base compensator voltage output, wherein the first base compensator output is coupled to the first BJT input and the second base compensator output is coupled to the second BJT input, and wherein the base compensator voltage output is coupled to the BJT voltage input.

2. The electronic system of claim 1, wherein the BJT input stage circuit comprises a first BJT and a second BJT, wherein a first base of the first BJT corresponds to the first BJT input and a second base of the second BJT corresponds to the second BJT input.

3. The electronic system of claim 2, wherein the BJT input stage circuit comprises a first current source and a plurality of transistors, wherein the transistors are coupled to a first collector of the first BJT and a second collector of the second BJT.

4. The electronic system of claim 3, wherein the base current compensator is configured to provide input current to the first BJT input and the second BJT input based on a control signal provided by the base current compensator.

5. The electronic system of claim 4, wherein the BJT input stage circuit is configured to set voltages at collectors of the first and second BJTs based on the control signal.

6. The electronic system of claim 4, further comprising:

a Hall sensor comprising a first Hall sensor output coupled to the first BJT input, wherein the Hall sensor is configured to provide a sensor signal to the first Hall sensor output that is indicative of a magnetic field measured by the Hall sensor.

7. The electronic system of claim 6, wherein the input current has a first frequency and the sensor signal has a second frequency, wherein the first frequency is equal to the second frequency.

8. The electronic system of claim 4, further comprising:

a filter having a filter input and a filter output, wherein the filter input is coupled to the amplifier output, wherein the filter is configured to generate a filtered output based on an output signal provided by the amplifier, wherein the filter generates the filtered output such that the input current is filtered out.

9. The electronic system of claim 1, further comprising:

a modulator having a first modulator input, a second modulator input, a first modulator output, and a second modulator output, wherein the first modulator output is coupled to the first BJT input and the second modulator output is coupled to the second BJT input; and a demodulator having a first demodulator input, a second demodulator input, a first demodulator output, and a second demodulator output, wherein the demodulator is coupled between the BJT input stage circuit and the amplifier, wherein the first demodulator input is coupled to the first BJT output, the second demodulator input is coupled to the second BJT output, the first demodulator output is coupled to the first amplifier input, and the second demodulator output is coupled to the second amplifier input.

10. An electronic system, comprising:

an instrumentation amplifier having a first input, a second input, a first output, and a second output, wherein the instrumentation amplifier comprises:

a first amplifier path extending from the first input to the first output, wherein the first amplifier path comprises a first modulator, a first bipolar junction transistor (BJT) input stage circuit, a first demodulator, and a first amplifier arranged in series on the first amplifier path;

a second amplifier path extending from the second input to the second output, wherein the second amplifier path comprises a second modulator, a second BJT input stage circuit, a second demodulator, and a second amplifier arranged in series on the second amplifier path; and a base current compensator having first base compensator outputs coupled to inputs of the first BJT input stage circuit and second base compensator outputs coupled to inputs of the second BJT input stage circuit, wherein a first BJT voltage input of the first BJT input stage circuit and a second BJT voltage input of the second BJT input stage circuit are coupled to a base compensator voltage output of the base current compensator.

11. The electronic system of claim 10, wherein an input of the first modulator is coupled to the first input, wherein the first BJT input stage circuit is coupled between the first modulator and the first demodulator, wherein an output of the first demodulator is coupled to an input of the first amplifier, wherein an input of the second modulator is coupled to the second input, wherein the second BJT input stage circuit is coupled between the second modulator and the second demodulator, and wherein an output of the second demodulator is coupled to an input of the second amplifier.

12. The electronic system of claim 10, wherein the first and second BJT input stage circuits are configured to receive a control signal at the first and second BJT voltage inputs, wherein the base current compensator is configured to inject input current on the inputs of the first and second BJT input stage circuits based on the control signal.

13. The electronic system of claim 10, wherein the instrumentation amplifier further comprises:

a tail current circuit comprising a first tail current input and a second tail current input, wherein a first tail current output of the first BJT input stage circuit is coupled to the first tail current input and a second tail current output of the second BJT input stage circuit is coupled to the second tail current input.

14. The electronic system of claim 10, wherein the first BJT input stage circuit and the second BJT input stage circuit respectively comprise a first BJT and a second BJT, wherein bases of the first and second BJTs of the first BJT input stage circuit correspond to the inputs of the first BJT input stage circuit, and wherein bases of the first and second BJTs of the second BJT input stage circuit correspond to the inputs of the second BJT input stage circuit.

15. The electronic system of claim 14, wherein the base current compensator comprises a plurality of transistors and a reference BJT, wherein the plurality of transistors are coupled between the reference BJT and the inputs of the first and second BJT input stage circuits, wherein the base compensator voltage output is coupled to a node between the reference BJT and the plurality of transistors.

16. The electronic system of claim 15, wherein the base current compensator is configured to provide a control signal to the first and second BJT voltage inputs, and wherein the reference BJT is configured to bias the inputs of the first and second BJT input stage circuits with an input current based on the control signal.

17. The electronic system of claim 16, wherein the input current matches base currents of the first and second BJTs of the first and second BJT input stage circuits.

18. An electronic system comprising:

an instrumentation amplifier comprising a first amplifier path and a base current compensator, wherein the first amplifier path extends between a first input and a first output of the instrumentation amplifier, wherein the first amplifier path comprises a modulator having an input corresponding to the first input, a bipolar junction transistor (BJT) input stage circuit having an input coupled to an output of the modulator, a demodulator having an input coupled to an output of the BJT input stage circuit, and an amplifier having an input coupled to an output of the demodulator and an output corresponding to the first output; and wherein a BJT voltage input of the BJT input stage circuit is coupled to a base compensator voltage output of the base current compensator, wherein the base current compensator is configured to generate and provide a control signal to the BJT voltage input, and wherein the base current compensator is configured to provide a modulated input current to the input of the BJT input stage circuit based on the control signal.

19. The electronic system of claim 18, further comprising:

a Hall sensor comprising a sensor output coupled to the first input, wherein the Hall sensor is configured to provide a sensor signal to the first input, wherein the instrumentation amplifier is configured to generate an output signal based on the sensor signal.

20. The electronic system of claim 19, wherein the modulated input current is modulated based on a first clock signal with a first frequency, wherein the Hall sensor is configured to modulate the sensor signal based on a second clock signal with a second frequency, wherein the modulator is configured to modulate the sensor signal based on a third clock signal with a third frequency.

21. The electronic system of claim 20, wherein the first frequency is equal to the second frequency, wherein the first clock signal is phase shifted relative to the second clock signal, and wherein the third frequency is greater than the first frequency.

* * * * *